United States Patent [19]
Robinson

[11] Patent Number: 4,596,962
[45] Date of Patent: Jun. 24, 1986

[54] EVACUATED, WALL-COATED, SEALED, ALKALI ATOM CELL FOR AN ATOMIC FREQUENCY STANDARD

[75] Inventor: Hugh G. Robinson, Durham, N.C.

[73] Assignee: Duke University, Durham, N.C.

[21] Appl. No.: 548,308

[22] Filed: Nov. 3, 1983

[51] Int. Cl.[4] .......................... H01S 1/06; H03B 17/00
[52] U.S. Cl. ........................................ 331/3; 331/94.1; 250/251
[58] Field of Search ................... 331/94.1, 3; 250/251

[56] References Cited
U.S. PATENT DOCUMENTS

| 3,242,423 | 3/1966 | Malnar | 331/3 |
| 3,281,709 | 10/1966 | Dehmelt | 331/94.1 X |
| 3,577,069 | 5/1971 | Malnar et al. | 331/94.1 X |
| 3,720,882 | 3/1973 | Tang et al. | 331/94.1 X |
| 3,798,565 | 3/1974 | Jechart | 331/3 X |
| 3,903,481 | 9/1975 | Jechart | 331/3 |
| 4,405,905 | 9/1983 | Busca et al. | 331/94.1 |

OTHER PUBLICATIONS

R. G. Brewer, "Study of Atom–Wall Collisions by Optical Pumping*", *J. Chem. Phys.* 38, 3015 (1963).
J. Vanier et al., "Relaxation and Frequency Shifts in the Ground State of $Rb^{85}$", *Phys. Rev.*, vol. 9, p. 1031 (1974).
A. Risley et al., "The Dependence of Frequency Upon Microwave Power of Wall–Coated and Buffer–Gas–Filled Cell $Rb^{87}$ Frequency Standards", *J. Appl. Phys.* 51, (9), p. 4571 (1980).
Bouchiat et al., *Physical Review*, "Relaxation of Optically Pumped Rb Atoms on Parafin–Coated Walls", vol. 147, No. 1, Jul. 8, 1966.
Brewer, "Study of Atom–Wall Collisions by Optical Pumping", *Journal of Chemical Physics*, vol. 38, No. 12, Jun. 13, 1963.
Robinson et al., "Narrow $^{87}Rb$ Hyperfine–Structure Resonances in an Evacuated Wall–Coated Cell", *Applied Physics Letters* 40(9), May 1, 1982, pp. 771–773.

Primary Examiner—Eugene R. LaRoche
Assistant Examiner—D. C. Mis
Attorney, Agent, or Firm—Oblon, Fisher, Spivak, McClelland & Maier

[57] ABSTRACT

An evacuated wall-coated sealed alkali atom cell for an atomic frequency standard, including a cell bulb having an inner wall subjected to cleaning by means of a bakeout step and a r.f. scrubbing step under vacuum, whereupon the inner wall is provided with a deuterated paraffin coating. An alkali atom $^{87}Rb$ and/or $^{85}Rb$, and/or $^{133}Cs$ is sealed in the cell bulb under vacuum.

23 Claims, 4 Drawing Figures

SINGLE-ORIFICE CELL

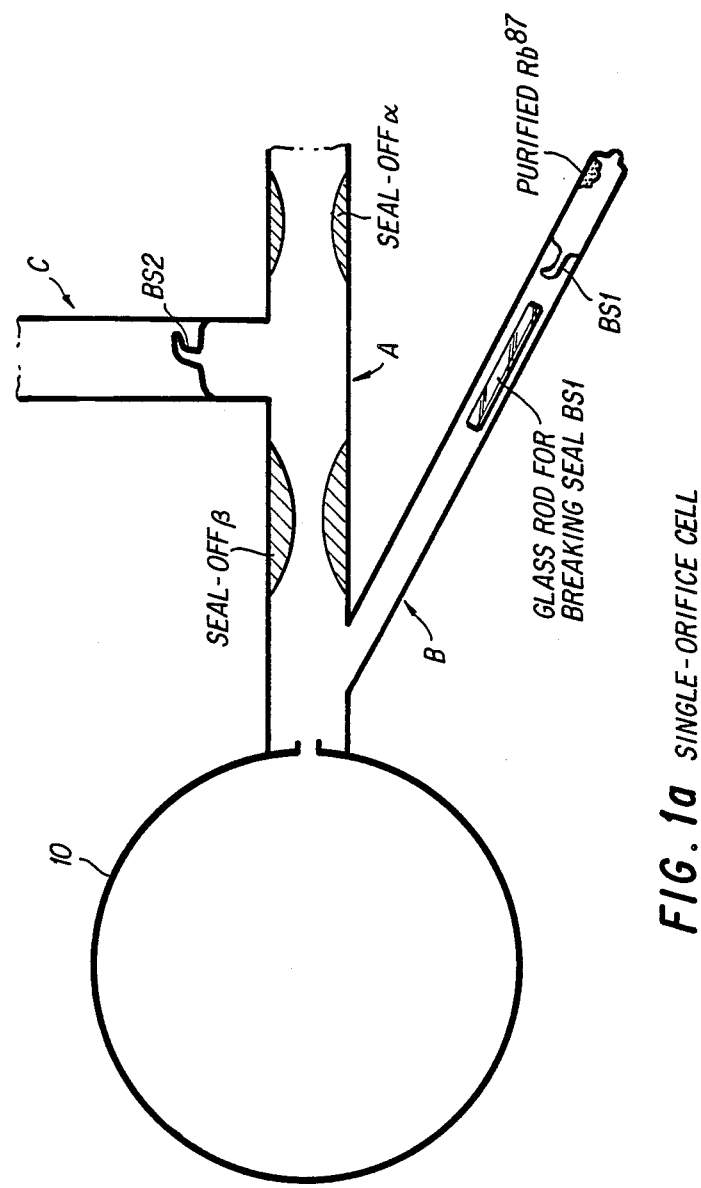
FIG. 1a SINGLE-ORIFICE CELL

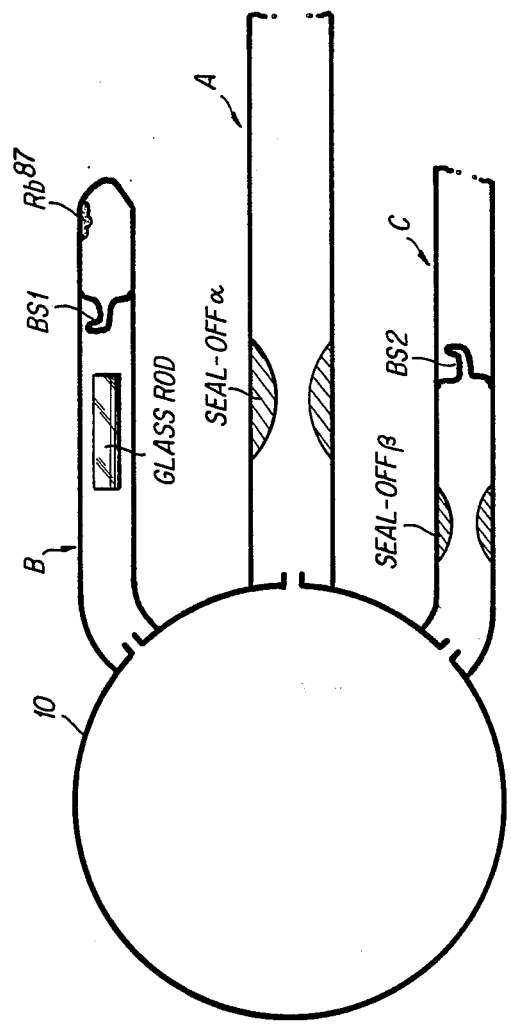
FIG. 1b MULTIPLE-ORIFICE CELL

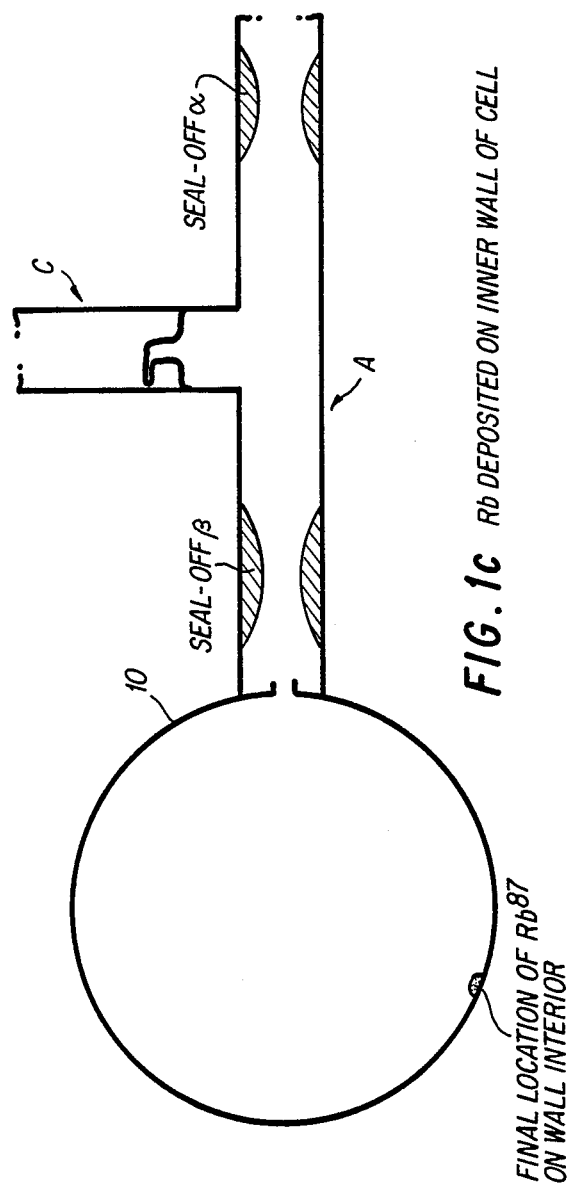
FIG. 1c Rb DEPOSITED ON INNER WALL OF CELL
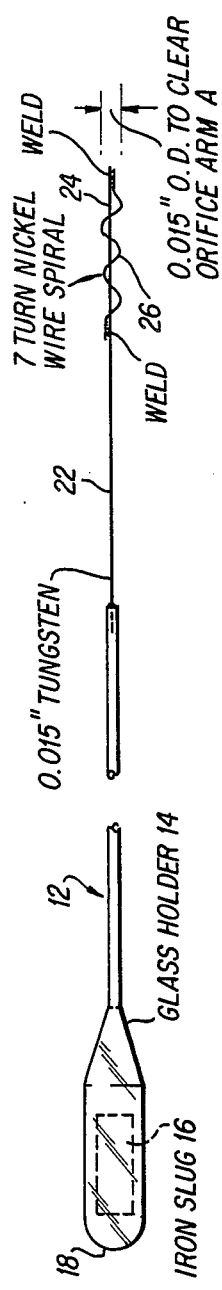
FIG. 2 WAX CARRIER DETAIL. WAX IS LOADED ON SPIRAL

EVACUATED, WALL-COATED, SEALED, ALKALI ATOM CELL FOR AN ATOMIC FREQUENCY STANDARD

The Government of the United States of America has rights in the invention disclosed and claimed herein pursuant to grant number PHY-80-13737 awarded by the National Science Foundation.

BACKGROUND OF THE INVENTION

1. Field of the Invention

This invention relates generally to atomic frequency standards, and more particularly to evacuated, wall-coated, sealed alkali atom cells for rubidium (or Cesium) atomic frequency standards.

2. Description of the Prior Art

Commercial rubidium frequency standards use cells filled with buffer gas. A primary function of such a gas is to slow Rb atom diffusion to the wall, thereby providing a longer lifetime for the hyperfine states being interrogated. Systematic effects associated with this choice include temperature and pressure coefficients of the hyperfine-structure (hfs) transition frequency, and an inhomogeneously broadened line shape which results in a shift of the line center with light intensity, cell temperature, rf power, rf field gradients, and magnetic field gradients.

An alternative containment device proposed by Ramsey Rev. Sci. Instrum. 28 57 (1957), and first demonstrated in a Rb optical pumping experiment Rev. Sci. Instrum. 28 57 (1957) by Robinson, Ensberg, and Dehmelt Bull. Am. Phys. Soc. 3, 9 (1958), is the wall-coated evacuated cell.

Robinson and Johnson, Appl. Phys. Letl. 40 (90), May 1, 1982, with interest toward exploring the potential of such cells for use in frequency standards, presented results on the line shape of $^{87}$Rb hfs resonances showing significant improvement over previous results. In particular, a conventional optical pumping apparatus employing a Rb resonance lamp, D1 pass filter, circular polarizer, cell, and Si photodetector was used. A magnetic field of 1.5 G was applied to resolve all transitions. The rf power for observation of the hfs transitions was provided by a waveguide horn or a loop antenna driven by a klystron phase locked to a harmonic of a frequency synthesizer. A low modulation rate of 0.3125 Hz was used since the response time of the Rb atom ensemble in the cell was about 1 s. The analog output of the Si photodetector was amplified and demodulated by means of a phase-sensitive detector. This signal was then digitized by a voltage-to-frequency converter and a gated counter. A computer interfaced not only to this counter but also to the frequency-synthesizer controlled data acquisition.

Preparation of the 200-cm$^3$ spherical Pyrex cell included the formation of wall orifices together with ring-sealed tubing centered on each orifice. Typically, these are present for primary evacuation, for introduction of the wall coating, for connection to the $^{87}$Rb reservoir (98% isotopic purity), and for future breakseal access to the cell, if desired. Cell cleaning included a 12-h vacuum bakeout at 350° C. followed by plasma scrubbing with both hydrogen and helium gases. Purified n-tetracontane was evaporated onto the wall from a removable central wax carrier and the Rb reservoir ampoule attached to the cell was then opened. Surface coating and curing were done under active vacuum pumping. Since the cell used had been sealed off from any pumping since 1968 (over ten years), it was apparent that long-term operation of such cells is feasible. Robinson and Johnson, supra, therefore monitored the time dependence of cell parameters to ascertain their stability.

The experiments performed by Robinson and Johnson, supra, demonstrated that an evacuated wall-coated cell which had been sealed for more than 10 years can have hfs resonances whose linewidths are a factor of 70 less than those in conventional buffer gas filled cells used in modern Rb atomic frequency standards. Robinson and Johnson, supra, theorized that since the Q of the resonance is increased by this same factor, the flicker-of-frequency noise floor (H. Hellwig, Radio Sci., 14, 561 (1979)), would be substantially improved, and that because the line shape in the wall-coated cell is homogeneously broadened, the major systematic effects limiting the precision of current Rb atomic frequency standards should be greatly reduced. Robinson and Johnson, supra, concluded that although questions of reproducibility and stability of the wall shift remain to be explored, the achievement of so narrow a linewidth in a long term sealed cell showed potential for use of the wall-coated cell in frequency standards.

Examples of gas cell atomic frequency standards are disclosed in U.S. Pat. Nos. 4,798,565 and 3,903,481.

Other prior art publications of interest are Risley et al, J. Appl. Phys. 51, (9), Sept., 1980; Brewer, J. Chem. Physics., Vol. 38, Number 12, June 15, 1983, pp. 3015–3020, and Bouchiat et al, Physical Review, Vol. 147, No. 1, July 8, 1966, pp. 41–57.

The disclosure of each of the above-noted publications, as well as the other prior art noted therein, are incorporated by reference herein.

SUMMARY OF THE INVENTION

Accordingly, one object of this invention is to provide a novel evacuated wall-coated, sealed alkali atom cell for an atomic frequency standard which represents a technological simplification over the prior art cell.

Another object is to provide a novel alkali atom cell, as above-noted, which is sealed and requires no attachment to a vacuum apparatus.

A further object is to provide a novel alkali atom cell, as above-noted, which uses rubidium or cesium instead of hydrogen, whereby it is possible to dispense with the conventional discharge equipment associated with the use of hydrogen.

Yet another object of this invention is to provide a novel alkali atom cell as above-noted, characterized by greatly narrowed hyperfine resonance linewidths in comparison to the conventional gas cell.

Still another object of this invention is to provide a novel alkali atom cell, as above-noted, which has a homogeneously broadened lineshape leading to improved frequency stability, instead of the inhomogeneously broadened lineshape obtained with the conventional gas cell.

These and other objects are achieved by providing a new and improved evacuated, wall-coated, sealed alkali atom cell for an atomic frequency standard, including a cell bulb made of e.g., Pyrex or quartz, having inner walls cleaned by subjection to bakeout and r.f. plasma scrubbing using hydrogen and/or helium, wherein a deuterated paraffin wall coating material is applied to the bulb inner wall after cleaning thereof.

In a preferred embodiment, the plasma scrubbing is performed at a frequency of 100 MHz, and the deuterated coating is applied by providing a central carrier on which the deuterated paraffin is formed, placing the carrier within the bulb, and heating the deuterated paraffin to evaporate the deuterated paraffin, whereby a uniform coating is produced.

The objects of the invention are achieved also by means of the method of fabricating the cell of the invention, including cleaning a cell bulb by means of at least one bakeout step followed by at least one R.F. plasma scrubbing step, coating the bulb inner wall by evaporating a deuterated paraffin on the inner wall, introducing purified $^{87}$Rb and/or $^{85}$Rb into the coated bulb, curing the cell bulb while applying a vacuum thereto until a stable linewidth and signal amplitude is achieved, and sealing the cell bulb.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1a, 1b and 1c are schematic side views of alternative embodiments of the alkali atom cell of the invention; and FIG. 2 is a schematic side view of a carrier for introducing deuterated paraffin into the cell bulb prior to evaporation of the deuterated paraffin on the inner wall of the cell bulb.

DESCRIPTION OF THE PREFERRED EMBODIMENTS

Referring now to the drawings, wherein like reference numerals designate identical or corresponding parts throughout the several views, and more particularly to FIGS. 1a and 1b thereof, sketches of two possible cell geometries are shown. The cell of the invention includes a bulb 10 and one or more orifices communicating with the bulb 10. The example in FIG. 1a minimizes the number of orifices in the cell wall to one. $^{87}$Rb isotope is purified by triple distillation under vacuum and is deposited in a cleaned evacuated breakseal BSI. This breakseal unit is then used to form arm B including a glass rod (non-magnetic) for later opening of the breakseal BS1. The orifice diameter is typically $\leq 1.5$ mm for 100-200 cm$^3$ volume cells. Arm A provides primary connection to the vacuum system and also allows a plasma scrubbing gas to be back-filled after initial cleaning by bakeout as discussed hereinafter.

After plasma scrubbing is completed, a deuterated paraffin coating is formed on the inner wall of the bulb 10. Shown in FIG. 2 is a carrier 12 used in the formation of the bulb wall coating. Carrier 12 includes a glass holder 14 having an iron slug 16 embedded at one relatively thick distal end 18. Embedded in, and protruding from, a thinner opposite distal end 20 is a tungsten wire 22, having an end 24 around which is wound a nickel wire spiral 26 (O.D.=0.015 inches). Spiral wire 26 is loaded with deuterated paraffin.

During fabrication, the carrier 12 is brought up arm A by magnet and positioned so that the spiral paraffin loaded wire 26 is inside the cell. Induction heating then melts the deuterated paraffin wax and raises its vapor pressure to produce a thin coating of purified wax on the wall. (Purification is by vacuum distillation with a fraction collected with a well-defined melting temperature with melting point temperature range $\leq 2°$ C.) Then the carrier 12 is removed and the cell sealed off at $\alpha$. The Rb breakseal BS1, in arm B is opened and the cell rejoined to a vacuum system at C. Breakseal, BS2, is opened to again pump on the cell during curing. Instead of the primary vacuum system, a small vac-ion pump is convenient to use at this stage since it permits monitoring of the "curing" of the cell by actually observing the hyperfine resonance desired. (The small pump provides the portability required to place the cell in the optical pumping apparatus for signal acquisition.) The curing time is dependent on coating thickness and is inversely proportional to Rb density at the cell wall; heating the cell then reduces the curing time. The wall coating is not allowed to reach its melting point. The wall is cured when a stable linewidth and signal amplitude are achieved. Curing times typically require a few days. After curing is complete, the cell is sealed off at $\beta$. No further connection to any vacuum system is then required.

In FIG. 1c is shown schematically a cell in which the $^{87}$Rb is deposited directly on the waxed wall. The deposit is localized to ~1 mm diameter by establishing appropriate temperature gradients during deposition and use of the cell. Such a cell has been built and successfully operated.

The above-described invention results in improvements over the prior art using wall-coated, evacuated, sealed cells for rubidium (or Cesium) atomic frequency standards. These improvements consist of (a) a cell sealed off from any vacuum system and (b) a hyperfine resonance linewidth substantially narrower than previously attained by others using either wall-coated evacuated cells or the gas-filled cells currently used in rubidium frequency standards. Optical pumping has been used in the reduction to practice as a means of observing the resonances.

Cell Cleaning

The sealing off of the cell from any vacuum system is implemented by suitably cleaning the cell prior to wall-coating. The following procedure is used in cleaning Pyrex (or quartz) cells: 12 hour bakeout at 350° C. under vacuum; plasma scrubbing the inner walls with hydrogen and/or helium as the discharge gas. This scrubbing procedure consists of backfilling the cell with purified H$_2$ gas until a bright discharge is struck when using an r.f. ~100 MHz, power oscillator (not shown) coupled into the gas via the electric and magnetic fields present in an oscillator coil (not shown). Extended stability is achieved by r.f (~100 MHz) plasma scrubbing. Thus, the use of r.f. (~100 MHz) drive is superior to conventional low frequency Telsa coil cleaning and promotes uniformity of wall cleaning. As an example, a 100 cm$^3$ spherical sample would require approximately 100 watts of rf power at approximately 0.1 Torr pressure of H$_2$. The primary requirement is that the hydrogen atomic line spectrum (not molecular band spectra) be achieved. The cell is pumped out after several minutes and the process repeated until the atomic line spectrum of hydrogen strongly dominates other spectra—this indicates a clean cell. The number of cycles of this scrubbing depends on initial cell contamination and level of rf power used. The process produces not only a surface cleaning but also a sub-surface cleaning thereby providing for long cell lifetime after final seal-off from the vacuum. Helium gas is also useful in plasma scrubbing and may be alternated in cycles with hydrogen. The cleaning process involves not only heat and ion excited state bombardment, but also Lyman alpha radiation from hydrogen.

The above cleaning procedure obviates the need for a getter. However, a getter can nevertheless be used if so desired. Bouchiat et al, supra, used a barium getter apparently leaving the carrier wire (nickel) in place near the active volume of the cell. The use of such magnetic material is to be avoided in frequency standard or magnetometer cells. We have constructed cells with a barium film by evaporating the barium in a glass side-arm attached to the main volume of the cell and then withdrawing the carrier wire, all under vacuum. In U.S. Pat. No. 3,904,260 Shernoff et al, a similar technique is described which uses a separate ampoule.

The achievement of $^{87}$Rb hyperfine transition resonances ($\sim$6.8 GHz) with narrow linewidths ($\leq$10 Hz) is obtained by use of a deuterated paraffin wall coating material, i.e., a single-bond long chain hydrocarbon compound exhibiting a high melting temperature (e.g., deuterated dotriacontane, tetracontane, or polyethylene) and appropriate cell geometric design. In selecting a particular deuterated paraffin, melting temperature is an important parameter because cell performance degrades as the melting temperature is approached. Therefore, depending upon the circumstances of a particular application, the identified long chain compounds, and others such as tetratetracontane, octatetracontane, etc., having high melting temperatures, are preferred. However, for some applications lower melting point deuterated paraffins, such as eicosane (melting temperature=38° C.) can be used, although it is anticipated that 38° C. is a lower limit on melting temperature for most applications. Cell geometric design is discussed below, and touched upon in the prior art article by Robinson and Johnson, supra.

Magnetic fields originating from the nuclei of the wall coating relax the Rb spin while the Rb is in contact with the wall. This effect is proportional to $I(I+1)\gamma^2$, I=nuclear spin and $\gamma$=gyromagnetic ratio of wall nuclei, and to the fraction of time spent on the wall relative to t, the time between wall collisions. Thus, linewidth reduction is effected by using deuterated wall coatings and larger cells. The deuterated coating (100% isotopic purity) should provide a factor of $\sim$16 reduction in this linewidth component while the factor due to cell size is inversely proportional to $\bar{R}$, a characteristic dimension of the cell (e.g., $\bar{R}=4\times$radius/3 for sphere). Cell size $>\frac{1}{2}$ of the microwave wavelength, $\lambda$, is advantageous.

A second cause of linewidth due to the cell wall is the dispersion in wall phase shift; the width in Hz is given by $\phi^2/\pi t_c$ where $\phi$ is the average phase shift/wall collision and $t_c$ is the correlation time for Rb-wall collisions. Reduction of this component is made by increasing cell size which linearly increases $t_c$ with $\bar{R}$. Reduction in linewidth is then determined by geometric constraints on maximum cell size. Use of diameters $>\lambda/2$ has been successfully demonstrated. (See Robinson and Johnson, supra.)

Another method of reducing the linewidth caused by dispersion in phase $\phi$, is by increasing cell-wall temperature. This will lower $\phi$ by reducing sticking time on the wall. Reduction in linewidth due to $\phi$ by a factor between 2 and 3 is attainable by this technique, and this is another reason why deuterated paraffins having high melting temperature are preferred. Thus, this technique is limited to a cell-wall temperature somewhat below the melting temperature of the cell wall coating, since linewidth increases as the melting temperature is approached.

The uncoated areas on the cell wall, including orifices for cell evacuation, wall coating and alkaliatom introduction, contribute to the linewidth since they provide a lifetime limit for observation of the hfs resonance. Therefore, it is advantageous to minimize both the number and size of such orifices. The linewidth due to an uncoated area "a" is inversely proportional to the volume of the cell and hence can be reduced by use of larger cells. The linewidth is given by $\bar{v}a/(\pi V)$ Hz, where $\bar{v}$ is the mean speed and V the volume of the cell.

A totally coated cell bulb wall will have minimum linewidth, implying zero orifices. In principle, this can be realized by coating the cell bulb wall as above described and then using the same or another paraffin carrier 12 loaded with sufficient deuterated paraffin to seal the orifice. Alkali-atom would then have to be deposited prior to cell coating formation, followed by a thin coating of the deuterated paraffin being formed, with the alkali atom then either diffusing through the paraffin coating, or otherwise passing through imperfections in the coating, to the inner volume of the cell bulb.

A source of broadening which depends on cell size but not on the cell wall coating is that due to the applied d.c. magnetic field B. For a simple case where the field inhomogenity $\Delta B_n$ is given by a single Legendre polynomial term of order n, the contribution to linewidth $$<(\gamma \Delta B_n)^2>t_c/2\pi$$

scales as $R^{2n+1}$, where $\gamma \Delta B_n$ is the angular frequency width due to the unaveraged inhomogeneity. The effective value of $\gamma/2\pi$ for an observed transition is proportional to the rate of change of frequency with applied magnetic field B. It is 1149.7 B Hz/G for the $(F,m_F)=(2,0)\rightarrow(1,0)$ "clock" transition. This small value makes it feasible to reduce this source of linewidth to insignificant levels by taking reasonable care in providing for field homogeneity. Thus even for cells with $\bar{R}>\lambda/2$, no appreciable linewidth occurs from this source.

Other linewidths obtain which are not the direct result of cell design, such as, for example, microwave power saturation, optical pumping light intensity caused width, and electron spin exchange between colliding Rb atoms. These are affected by operating parameters. The use of large cell size provides an increase in signal proportional to the volume of the cell (i.e., number of atoms observed) at constant atom density, thus permitting a good signal-to-noise ratio while allowing for suppression of spin-exchange width.

$$(\sim n_{Rb} \times 2.4 \times 10^{-10} \text{ Hz}),$$

which is proportional to Rb density, $n_{Rb}$. An additional advantage in signal-to-noise accrues from the deuterated wall through reducing relaxation at the wall. This provides for not only narrower lines (and hence more S/N) but also permits larger population difference between the hyperfine levels being observed for conditions of minimum perturbation by optical pumping light. That is, a lower light intensity can produce large S/N in a cell with long wall-relaxation times.

The lineshape obtained in an evacuated wall-coated cell is a broad Gaussian pedestal having a width comparable to the Doppler width (~9 kHz) with a narrow Lorentzian "spike" (width ~10 Hz for 200cm$^3$ sphere) centered on the pedestal. The ratio of spike amplitude to pedestal amplitude is proportional to $$[<B_1>^2/<B_1^2>] \times [\Delta \nu_p/\Delta \nu_s]$$

where $B_1$ is the component of the microwave magnetic field stimulating the resonance and $< >$ signifies spatial average. $\Delta \nu_p$ and $\Delta \nu_s$ are the linewidths of the pedestal and spike, respectively. Thus, a smaller $\Delta \nu_s$ improves the relative size of the spike to the pedestal heights. This is one factor relating to the importance of long-relaxation times against wall-collision effects. The cell described in the article by Robinson and Johnson, supra, has a diameter to half-wavelength ratio of approximately 3.3. It has a 12/1 spike height to pedestal height ratio. The $B_1$ field is presented to the cell in any one of several means: a microwave horn which produces a traveling wave through the cell; a small loop antenna; or via a microwave cavity.

Consistent with the spike amplitude to pedestal amplitude expression given above, any microwave structure generating the $B_1$ oscillating magnetic field used to stimulate the microwave transition should not be operated so that $<B_1>^2$ is close to vanishing. Where a microwave cavity is used to produce $B_1$, a reasonable choice is the $TE_{011}$ mode cavity. An acceptable geometry for the cell fitting inside the cavity would be either a sphere or a cylinder with radius ~70% of the cavity radius and a length in the axial direction almost touching the end walls of the cavity. This implies the characteristic cell dimension $\overline{R} \approx \lambda/2$, in terms of the free-space wavelength.

If a miniaturization requirement must be met, cells with $\overline{R} < \lambda/2$ can be used. Linewidth will be increased according to the cell size dependence already discussed (major dependence increases linewidth proportional to $1/\overline{R}$) and the resonance signal may be less than that for larger cells. Nevertheless, improved performance of an atomic frequency standard obtains for the evacuated wall-coated cell relative to that of the buffer gas-filled cell of the same characteristic size.

Another variation using the evacuated wall-coated sealed cell uses the $^{85}$Rb isotope. Several advantages may obtain:

1. If a criterion used in choosing cell size is to use the maximum size compatible with allowing no microwave magnetic field spatial phase change across the cell, then the ratio of volumes of the $^{85}$Rb-cell to that of the $^{87}$Rb-cell is $[\lambda(85)/\lambda(87)]^3 = 11.4$ where $\lambda$ is the wavelength of the hyperfine transition for the isotope indicated. Thus, aside from multiplicity factors and at constant Rb density, the 85-cell would have an advantage in signal by this same factor, ~11.

2. The ratio of hyperfine transition frequencies $\omega(85)/\omega(87) = 0.44$. The phase shift per collision with the wall is proportional to the hyperfine frequency and thus, for $^{85}$Rb is 0.44 times that for $^{87}$Rb. The reduced phase shift per collision increases the number of wall collisions required to de-phase by a factor of $1/0.44 = 2.3$. Thus the linewidth due to dispersion in phase caused by wall collisions, which can be the dominant component of the total width, is 1/2.3 times that of $^{87}$Rb.

3. The Q of a hyperfine transition depends on the choice of cell size, since the linewidth depends on cell size. The hyperfine transitions of both Rb isotopes have Q's nearly the same, indicating that this parameter which enters into both short and long term stability considerations need not be significantly degraded in choosing the lower frequency $^{85}$Rb isotope. Suitable cell size choice can make the 85-Q larger than that of the 87-Q.

4. The absolute shift in the hyperfine frequency due to wall collisions and the temperature coefficient of this shift are proportional to the hyperfine frequency itself. Thus, in cells of the same size, the $^{85}$Rb values of these parameters are 0.44 times those of the $^{87}$Rb isotope. Since a larger cell can be used for the $^{85}$Rb isotope, a relative improvement can be obtained in the fractional wall shift and its temperature coefficient. The scaling factor is the ratio of the radii of the cells: i.e. for the criterion used in 1., improvement by a factor of ~2.3 would be obtained.

A buffer gas can be added to the wall-coated cell of the invention, whereby the buffer gas pressure can be used to "tune" the hf transition according to the pressure shift coefficient for the species used. For example, for Ne and $^{87}$Rb, this coefficient is +392 Hz/Torr Ne. The basic requirement is to maintain the advantages of the wall-coated cell; i.e., to maintain a homogeneously broadened lineshape. This requires many wall visits during the lifetime ($1/\pi$ linewidth) of the transition observed. Thus good averaging over the volume of the cell must be achieved over the radiative lifetime of the hf transition. As an example, to tune out the wall shift of ~ $-80$ Hz for $^{87}$Rb in a 2.3 cm radius cell, the pressure of Ne needed is $392/80 = 4.9$ Torr. This still permits conditions for good averaging to exist. Furthermore, this low a Ne pressure will not appreciably affect the polarization of the alkali through the Ne Rb collisions. Fine tuning can be achieved through the applied magnetic field. The quadratic Zeeman effect coefficient for $^{87}$Rb is ~1150 $B_o^2$ Hz in Gauss.

If a buffer gas is added to the wall-coated cell, the time to move a typical distance between wall collisions ($4R/3v$ sphere) is increased due to diffusion through the gas. However, there is no change in the average wall collision rate for the atom species used for the hyperfine transition (say Rb). Thus addition of even small amounts of buffer gas will not narrow the observed hf resonance.

The averaging of spatial field inhomogeneities is poorer with buffer gas present resulting in shorter $T_1$ and $T_2$ and hence in a broader and weaker hf signal.

The buffer gas can cause mixing in the excited $^2P$ optical state used for optical pumping. The effect is to decrease the efficiency of the pumping process thereby requiring more light intensity to achieve a given pumping rate. The pressure of buffer gas depends on the $^2P$ depolarization cross section for the alkali and buffer gas species used.

Related publications of interest, which are also incorporated by reference herein, are: H. G. Robinson and C. E. Johnson, "A New Heart for Rb Frequency Standards?: The Evacuated, Wall-Coated Sealed Cell", IEEE Transactions on Instrumentation And Measurement, Vol. IM-32, No. 1, March 1983, p. 198; H. G. Robinson and C. E. Johnson, "NARROW $^{87}$Rb and 133$_{Cs}$ HYPERFINE TRANSITIONS IN EVACUATED WALL-COATED CELLS", Presented at Fourteenth Annual Precise Time and Time Interval Applications and Planning Meeting, NASA Goddard, Nov. 30-Dec. 2, 1982, and C. L. J. Newton and H. G. Robinson, "STUDY OF MULTIPLE OPTICAL TRANSITIONS IN $^{87}$Rb USING LASER DIODES", Presented at Fourteenth Annual Precise Time and Time Interval Applications and Planning Meeting, NASA Goddard, Nov. 30-Dec. 2, 1982.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by the Letters Patent of the United States is:

1. An evacuated wall-coated sealed alkali atom cell for an atomic frequency standard, comprising:
    a bulb having an inner wall coated with deuterated paraffin;
    alkali atoms disposed in said bulb;
    the inner wall of the cell bulb having been subjected to cleaning by means of a bakeout step for a predetermined time period an a r.f. (radio frequency) plasma scrubbing step prior to coating thereof; and
    the inner wall of the cell comprising only a single orifice through which both said deuterated paraffin and said alkali atoms are introduced into said cell bulb;
    whereby a narrow hyperfine resonance line width is achieved.

2. A cell according to claim 1, comprising: the inner wall having been subjected to said r.f. plasma scrubbing performed at a frequency of 100 MHz using an element selected from the group consisting of hydrogen and helium.

3. A cell according to claim 1, wherein said alkali-atoms comprise $^{87}$Rb.

4. A cell according to claim 3, wherein said alkali-atoms comprise $^{85}$Rb.

5. A cell according to claim 1, wherein said alkali atoms comprise alkali atoms selected from the group consisting of $^{87}$Rb, $^{85}$Rb, and $^{133}$Cs.

6. A cell according to claim 1, wherein said bulb has a characteristic dimension $\overline{R}$, and $\overline{R} \div \lambda/2$, where $\lambda=$ wavelength of a hyperfine transition produced in said bulb.

7. A cell according to claim 2, wherein said bulb has a characteristic dimension $\overline{R}$, and $\overline{R} \div \lambda/2$, where $\lambda=$ wavelength of a hyperfine transition produced in said bulb.

8. A cell according to claim 3, wherein said bulb has a characteristic dimension $\overline{R}$, and $\overline{R} \div \lambda/2$, where $\lambda=$ wavelength of a hyperfine transition produced in said bulb.

9. A cell according to claim 4, wherein said bulb has a characteristic dimension $\overline{R}$, and $\overline{R} \div \lambda/2$, where $\lambda=$ wavelength of a hyperfine transition produced in said bulb.

10. A cell according to claim 5, wherein said bulb has a characteristic dimension $\overline{R}$, and $\overline{R} \div \lambda/2$, where $\lambda=$ wavelength of a hyperfine transition produced in said bulb.

11. A cell according to claim 1, wherein said deuterated paraffin is a single-bond long chain hydrocarbon compound having a melting temperature equal to or greater than 38° C.

12. A cell according to claim 11, wherein said deuterated paraffin comprises:
    a deuterated compound selected from the group consisting of deuterated eicosane, dotricontane, tetracontane, tetratetracontane, octatetracontane and polyethylene.

13. A cell according to claim 6, wherein said deuterated paraffin is a single-bond long chain hydrocarbon compound having a melting temperature equal to or greater than 38° C.

14. A cell according to claim 13, wherein said deuterated paraffin comprises:
    a deuterated compound selected from the group consisting of deuterated eicosane, dotricontane, tetracontane, tetratetracontane, octatetracontane and polyethylene.

15. A cell according to claim 1, comprising:
    a plug of deuterated paraffin sealing said single orifice with said alkali atoms sealed in said bulb.

16. A cell according to claim 1, comprising: a buffer gas sealed in said cell bulb.

17. A cell according to claim 1, comprising: a getter disposed in said cell bulb.

18. A method of fabricating an evacuated sealed alkali-atom cell for an atomic frequency standard whereby the cell exhibits narrow hyperfine resonance linewidth, comprising:
    subjecting an inner wall of a cell bulb to a bakeout step at a predetermined temperature and for a predetermined time under vacuum followed by a r.f. (radio frequency) plasma scrubbing step using an element selected from the group consisting of hydrogen and helium as a discharge gas;
    introducing a deuterated paraffin material through a single orifice in the wall of the bulb into the interior of the bulb and coating the inner cell bulb wall with said deuterated paraffin material;
    introducing alkali atoms into said bulb through said single orifice and
    sealing said bulb under vacuum.

19. A method according to claim 18, wherein said bakeout step is performed at a temperature of 350° C. for twelve hours.

20. A method according to claim 18 wherein said r.f. plasma scrubbing step is performed at a frequency of 100 MHz.

21. A method of fabricating an evacuated sealed alkali-atom cell for an atomic frequency standard, whereby the cell exhibits narrow hyperfine resonance linewidth, comprising:
    subjecting an inner wall of a cell bulb to a bakeout step at a predetermined temperature for a predetermined time under vacuum followed by a r.f. (radio frequency) plasma scrubbing step using an element selected from the group consisting of hydrogen and helium as a discharge gas;
    introducing alkali atoms into said bulb through a single orifice formed in the walls of said bulb; and
    introducing a deuterated paraffin material into said bulb through said single orifice and coating the inner cell bulb wall with said deuterated paraffin material;
    plugging said single cell bulb orific with deuterated paraffin.

22. A method according to claim 21, wherein said bakeout step is performed at a temperature of 350° C. for twelve hours.

23. A method according to claim 21 wherein said r.f. plasma scrubbing step is performed at a frequency of 100 MHz.

* * * * *